United States Patent
Ishijima (10) Patent No.: US 7,378,053 B2
(45) Date of Patent: May 27, 2008

(54) METHOD FOR PRODUCING COPPER-BASED MATERIAL WITH LOW THERMAL EXPANSION AND HIGH HEAT CONDUCTIVITY

(75) Inventor: Zenzo Ishijima, Matsudo (JP)

(73) Assignee: Hitachi Powered Metals Co., Ltd., Matsudo-Shi (JP)

( * ) Notice: Subject to any disclaimer, the term of this patent is extended or adjusted under 35 U.S.C. 154(b) by 277 days.

(21) Appl. No.: 10/832,247

(22) Filed: Apr. 27, 2004

(65) Prior Publication Data

US 2004/0213692 A1 Oct. 28, 2004

(30) Foreign Application Priority Data

Apr. 28, 2003 (JP) ............................. 2003-123423
May 13, 2003 (JP) ............................. 2003-134305

(51) Int. Cl.
*B22F 3/12* (2006.01)

(52) U.S. Cl. ............................. 419/32; 419/23; 419/45; 419/38; 75/246; 75/247

(58) Field of Classification Search ................. 419/38, 419/32; 75/247, 248
See application file for complete search history.

(56) References Cited

U.S. PATENT DOCUMENTS

| | | | | |
|---|---|---|---|---|
| 2,033,709 A | * | 3/1936 | Hensel et al. ................ | 420/495 |
| 3,790,351 A | * | 2/1974 | Niimi et al. .................. | 75/247 |
| 3,807,968 A | * | 4/1974 | Finaly et al. ................ | 428/558 |
| 4,130,422 A | * | 12/1978 | Wang et al. .................. | 75/246 |
| 4,158,719 A | * | 6/1979 | Frantz ........................ | 428/567 |
| 4,437,890 A | * | 3/1984 | Hayasaka et al. ............. | 75/244 |
| 4,505,987 A | * | 3/1985 | Yamada et al. .............. | 428/553 |
| 4,836,979 A | * | 6/1989 | Bell et al. ....................... | 419/23 |
| 4,943,319 A | * | 7/1990 | Yanagawa et al. ............ | 75/229 |
| 5,152,959 A | * | 10/1992 | Scorey ........................ | 419/66 |
| 6,132,486 A | * | 10/2000 | Dixon ........................ | 75/247 |
| 6,623,542 B2 | * | 9/2003 | Yamashita et al. ............ | 75/243 |

FOREIGN PATENT DOCUMENTS

| | | | | |
|---|---|---|---|---|
| GB | 2067221 | A | * | 7/1981 |
| JP | 59-21032 | A | | 2/1984 |
| JP | 62-284032 | A | | 12/1987 |
| JP | 2-213452 | A | | 8/1990 |
| JP | 9-13102 | A | | 1/1997 |

* cited by examiner

*Primary Examiner*—Roy King
*Assistant Examiner*—Christopher Kessler
(74) *Attorney, Agent, or Firm*—Birch, Stewart, Kolasch & Birch, LLP (57) ABSTRACT

The invention proposes a copper-based material with low thermal expansion and high thermal conductivity having good machinability and adaptability to nickel plating and also proposes a method for producing the same. The copper-based material is prepared through the steps of: adding 5 to 60% of iron-based alloy power having a certain value in thermal expansion coefficient into a matrix powder of pure copper phase powder and/or a precipitation hardening copper alloy powder; mixing the powders together; compacting the obtained powder mixture into a green compact and sintering it at temperatures of 400 to 600° C.

6 Claims, 8 Drawing Sheets

Content of Powder in Particle Size of 50μm or More in Precipitation Hardening Copper Alloy Powder (%)

FIG. 14

Content of Powder in Partcle Size of 50μm or More in Pure Copper Powder (%)

FIG. 15

METHOD FOR PRODUCING COPPER-BASED MATERIAL WITH LOW THERMAL EXPANSION AND HIGH HEAT CONDUCTIVITY

This Non-provisional application claims priority under 35 U.S.C. § 119(a) on Patent Application No(s). 2003-123423 and 2003-134305 filed in Japan on Apr. 28, 2003 and May 13, 2003, respectively, the entire contents of which are hereby incorporated by reference.

BACKGROUND OF THE INVENTION

1. Field of the Invention

The present invention relates to a copper based material of low thermal expansion and high thermal conductivity that is suitable for producing, e.g., a heat sink, in which low thermal expansion coefficient that is comparable to the properties of silicon chips and ceramic boards, and efficient heat releasing property are required. The invention also relates to a method for producing the same.

2. Prior Art

Concerning a material for producing, for instance, a heat sink; a low thermal expansion coefficient and a high heat releasing property are required. As such a material, a copper-molybdenum-based alloy or a copper-tungsten-based alloy is generally used. These materials are employed in order to utilize both the high thermal conductivity of copper and the low thermal expansion coefficient of molybdenum or tungsten. For instance, it is disclosed in Patent Gazette: JPA No. S62-284032 (1987) that a material containing the dispersion of molybdenum phase in copper matrix can be obtained by compacting a mixed powder of copper and molybdenum under pressure and subjecting the obtained green compact to sintering at a temperature to generate the liquid phase of copper. In Patent Gazette: JPA No. S59-21032 (1984), materials containing copper dispersion in molybdenum skeleton or tungsten skeleton are disclosed that is produced by forming the skeletal structure through sintering molybdenum powder or tungsten powder at high temperatures and it is then subjected to copper infiltration.

Related Arts

[Patent Gazette 1] JPA No. S62-284032 (1987) and
[Patent Gazette 2] JPA No. S59-21032 (1984)

DISCLOSURE OF INVENTION

SUBJECT TO BE SOLVED BY INVENTION

Such materials, however; have a problem in that the costs for producing materials are high because the used molybdenum powder and tungsten powder are expensive. The material disclosed in the former Patent Gazette 1 is liable to deformed and sizes of products are uneven because they are produced through the liquid phase sintering. Therefore, the obtained material must be subjected to machining after the sintering. However, the material is not good in machinability owing to the hardness of molybdenum. Accordingly, the material containing the dispersion of such phase is not suitable in machinability. In the materials disclosed in the above-mentioned Patent Gazette 2, it is difficult to infiltrate copper into all void spaces in the skeleton. Therefore, the material is inferior in thermal conductivity and it tends to have large unevenness in quality. Moreover, the manufacturing cost is high because the copper infiltration step is required after the sintering at high temperature. The problems in machinability of the products are similar to those in the former Patent Gazette 1. Furthermore, they have another problem in that the nickel plating is difficult because molybdenum and/or tungsten is exposed after machining, although nickel plating is often done for soldering when a heat sink is produced.

The object of the present invention is to provide a material of high thermal conductivity, in which the dimensional accuracy and machinability are good enough and the nickel plating is acceptable, without the use of expensive materials such as molybdenum and tungsten.

METHOD TO SOLVE THE PROBLEMS

The copper based material with low thermal expansion and high thermal conductivity in accordance with the present invention is characterized in that it comprises a matrix selected from the group consisting of matrix of pure copper phase, a matrix of precipitation hardening copper alloy phase, and a matrix of the mixture of pure copper phase and precipitation hardening copper alloy phase, and it contains a dispersion of 5 to 60% by mass of iron-based alloy power having a thermal expansion coefficient of $6 \times 10^{-6}$/K or lower as measured below 100° C.

When the copper based material comprises a matrix of the mixture of pure copper phase and precipitation hardening copper alloy phase, the content of the pure copper phase is 75% by mass or less. In this case, it is preferable that the pure copper phase is dispersed in a network structure.

The method for producing the copper based material of low thermal expansion and high thermal conductivity in the present invention is characterized in the steps of:

adding 5 to 60% by mass of iron-based alloy power having a thermal expansion coefficient of $6 \times 10^{-6}$/K or lower as measured below 100° C. into a matrix powder selected from the group consisting of pure copper powder, precipitation hardening copper alloy powder, and premixed powder of them, mixing the iron-based alloy powder and the matrix powder to form a powder mixture of them, compacting the powder mixture under pressure into a green compact having a relative density of 93% or more, and sintering the green compact at a temperature in; the range of 400 to 600° C.

In the above production method, when the mixed powder of copper powder and precipitation hardening copper alloy powder are used as a matrix powder, it is characterized that the matrix powder contains 75% by mass or less of the pure copper powder.

In a preferable mode of the above production method, the copper powder has a particle size of smaller than 100 mesh (undersize of 100 mesh, that passes through 100 mesh sieve) and the content of powder having the particle size of 50 μm or more is 60% or less, preferably 40% or less. The precipitation hardening copper alloy powder has a particle size of smaller than 100 mesh and the content of the powder having the particle size of 50 μm or more is 70% or less. The iron-based alloy powder has a particle size of smaller than 100 mesh and the content of the powder having the particle size of 50 μm or less is 60% or less.

Furthermore, the precipitation hardening copper alloy powder is preferably obtained by the rapid solidification of precipitation hardening copper alloy. That is, the rapid solidified powder is obtained by quenching the molten alloy containing the solution of a component in an atomizing step, which component exists in supersaturated state at room temperature, to obtain the matrix powder containing a solid solution of the supersaturated component without precipitation.

EFFECT OF THE INVENTION

The copper based material with a low thermal expansion and a high thermal conductivity of the present invention contains a dispersion of 5 to 60% by mass of iron-based alloy power having a thermal expansion coefficient of $6 \times 10^{-6}$/K or less as measured below 100° C., in a matrix selected from one member of the group consisting of a pure copper phase matrix, a precipitation hardening copper alloy phase matrix and a matrix of the mixture of pure copper phase and precipitation hardening copper alloy phase. The material has excellent properties such as high thermal conductivity and low thermal expansion coefficient, a low production cost and a good machinability, because the iron-based alloy powder slightly dispersed in the matrix effectively suppresses the thermal expansion of the matrix. The material with the matrix powder containing the dispersion of precipitation hardening copper alloy phase is excellent in both the hardness and strength. Furthermore, in the production process, there is no necessity of additional solution treatment or aging treatment, so that the production can be carried out without difficulty thorough simplified process.

SUMMARY OF THE INVENTION

Used for producing the copper based material with low thermal expansion and high thermal conductivity of the present invention, is a matrix of any one of a pure copper phase matrix, a precipitation hardening copper alloy phase matrix and a mixed matrix of the pure copper phase and the precipitation hardening copper alloy phase.

The pure copper has an excellent thermal conductivity, so that when the pure copper is used for the matrix, a material having an especially high thermal conductivity can be produced. Meanwhile, the precipitation hardening copper alloy has a structure containing fine and uniform dispersion of the precipitation of supersaturated alloy component in the matrix. Such a copper alloy is superior in hardness and strength, although it is somewhat inferior in thermal conductivity as compared with the pure copper. Especially, the precipitation hardening copper alloy is suitable for use in a copper based low thermal expansion-high thermal conductivity material that is used for press fitting members. In the case of the mixture of pure copper phase and precipitation hardening copper alloy phase, the strength and thermal conductivity of the material can be controlled by regulating the mixing ratios in compliance with requirements in use.

As the precipitation hardening copper alloy, those that are used for lead frame can be employed. It is exemplified by Cu—Zr based alloy, Cu—Fe—P based alloy, Cu—Ni—Fe—P based alloy, Cu—Cr based alloy and Cu—Cr—Sn based alloy.

The iron-based alloy having a thermal expansion coefficient of $6 \times 10^{-6}$/K or less as measured below 100° C. used in the present invention, is exemplified by the alloys of Invar (Fe-36Ni), Super Invar (Fe-31Ni-5Co), Stainless Invar (Fe-52.3Co-10.4Cr), Kovar (Fe-29Ni-17Co), 42 Alloy (Fe-42Ni) and Fe-17B Alloy. These alloys are less expensive and have higher machinability as compared with the foregoing molybdenum and tungsten.

The above-mentioned iron-based alloy powder having a thermal expansion coefficient of $6 \times 10^{-6}$/K or less as measured below 100° C., is dispersed in the above-mentioned matrix and the surfaces of alloy powder are caused to react slightly with the matrix. Accordingly, the iron-based alloy powder strongly suppresses the thermal expansion of matrix to lower thermal expansion of the material owing to the strong bonding between the matrix and the iron-based alloy powder.

In the production method of the present invention, in order to attain the above diffused state of the iron-based alloy powder in the matrix, a matrix powder and iron-based alloy powder are mixed together and compacted into a green compact under pressure and it is sintered at temperatures in the range of 400 to 600° C.

When the sintering temperature is lower than 400° C., the thermal conductivity and strength of sintered products are not good due to insufficient diffusion of the matrix itself. When the sintering temperature is higher than 600° C., the effect to suppress thermal expansion is impaired and the thermal conductivity of the matrix is impeded as a result of excessive reaction of iron-based alloy powder with the matrix. Especially, if an iron-based alloy powder containing nickel is used, undesirable results are caused to occur because copper and nickel can form a continuous solid solution and the nickel diffuses excessively into the matrix. In the above-mentioned temperature range, the liquid phase of copper is not generated, so that the dimensional accuracy is excellent.

With the increase in the amount of dispersion of the above-mentioned iron-based alloy material in the matrix, the effect of suppressing thermal expansion increases. However, it causes the decrease of the relative amount of the matrix, and the thermal conductivity becomes low. When the content of the iron-based alloy powder is less than 5%, the effect to suppress thermal expansion is not sufficient. If the content of the iron-based alloy powder exceeds 60%, the relative amount of the matrix decreases and the thermal conductivity lower markedly. Accordingly, the content of the iron-based alloy powder is preferably in the range of 5 to 60%.

In the production method of the present invention, when the matrix contains the precipitation hardening copper alloy, the following advantages can be expected. In general production method of precipitation hardening copper alloy, the alloy component is formed into supersaturated solid solution by solution treatment in a matrix after casting, and the alloy component of super saturated solid solution is then precipitated out by aging treatment. However, the present invention is advantageous in that the precipitation hardening copper alloy powder is in the condition just like after the solution treatment in the atomizing process, therefore this treatment can be omitted.

After the solution treatment, if treatment to impart strain is done before aging treatment, it is desirable that the strain accelerates the precipitation during the aging. In the method of the present invention, because strain is accumulated in powder particles during the compacting of powder and this strain acts effectively. In this case, if rapid solidified powder is used, the component of supersaturated solid solution gives strain to powder particles, so that much strain is accumulated to produce more effect.

Moreover, in the method of present invention, the sintering temperature is in the range of 400 to 600° C. as described above, which temperature range is quite effective for the aging treatment, so that the precipitate is generated in the matrix by the effect of aging during sintering operation. Thus, both the diffusion bonding and aging treatment of powder particles can be effected simultaneously by sintering. Therefore, it is advantageous in that any additional aging process is not required.

As a result, in the method of present invention, the use of the precipitation hardening copper alloy is extremely effective in view of the fact that the aging precipitation can be done effectively and the strengthening of matrix can easily be attained without adding any of separate aging process. When the rapid solidified powder is used as the precipitation hardening copper alloy, the effect to improve strength is produced by the acceleration of age-precipitation owing to the increase of the strain in powder particles.

The foregoing copper based material with low thermal expansion and high thermal conductivity contains a dispersion of 5 to 60% of iron-based alloy power having a thermal expansion coefficient of $6 \times 10^{-6}$/K or less as measured below 100° C., in the matrix of pure copper phase. The iron-based power is diffused slightly into the matrix and suppresses strongly the thermal expansion of the matrix to provide the material having a high thermal conductivity and a low thermal expansion.

When the matrix comprises the precipitation hardening copper alloy phase, although the thermal conductivity is somewhat lower than the pure copper matrix, it has still sufficiently high thermal conductivity and in addition, it has a low thermal expansion, high hardness and high strength. The obtained material is suitable for use in producing various members with low thermal expansion and high thermal conductivity such as those used by press fitting because the deformation in press fitting operation is little.

When the matrix comprises the mixture of the pure copper phase and the precipitation hardening copper alloy phase, it is convenient that the desired characteristics in strength and thermal conductivity of the material can be controlled in compliance with the requirements in use. In this case, the thermal conductivity of material can be improved without lowering the strength, if the matrix contains the dispersed pure copper phase of 75% or less. It is desirable that the pure copper phase is dispersed in the form of network in the matrix.

With the increase of the ratio of pure copper phase in the matrix, the thermal conductivity is improved. When the ratio is more than 50%, however, the improving effect in thermal conductivity is not so conspicuous in view of the increased amount.

Meanwhile, the hardness is on an almost constant value up to the ratio of about 50% of the pure copper phase in the matrix, while if it exceeds 50%, the hardness tends to decrease. When the content of the pure copper phase exceeds 75%, the hardness decreases abruptly. Accordingly, the ratio of pure copper phase in the matrix must be 75% by mass or less. The ratio the pure copper phase is preferably in the range of 25 to 75% in view of the marked improving effect in thermal conductivity.

Such a copper based material with a low thermal expansion and a high thermal conductivity can be obtained without difficulty by mixing 75% or less by mass, preferably 25% to 75% by mass, of pure copper powder with the remainder of precipitation hardening copper alloy powder, to obtain a matrix powder mixture.

In the production method of the present invention, the sintering is carried out at temperatures in the range of 400 to 600° C. for the purpose of suppressing the diffusion of iron-based alloy powder into the matrix. In this temperature range, the liquid phase of copper cannot be formed, so that the powder mixture is not densified effectively. Therefore, in order to obtain a matrix having a high thermal conductivity, it is necessary to form previously a green compact having a relative density of 93% or more from, the powder mixture.

When a matrix powder of anyone of pure copper powder, precipitation hardening copper alloy powder and their mixture is used, the diffusion in sintering can be accelerated by subjecting the matrix powder to size reduction into fine powder, by which the neck growth among particles are increased. Furthermore, by making the particle size of the matrix powder smaller than that of the iron-based alloy powder, the matrix particles can form highly continuous structure to improve its thermal conductivity.

Meanwhile, when the particle size of iron-based alloy powder is also made finer, the problems are caused to occur in not only the lowering in flowability and die galling but also the increase in the diffusion amount with the matrix due to the increase in neck growth between contacting particles, the lowering of thermal conductivity of matrix and the increase in thermal expansion coefficient of iron-based alloy powder due to the change of composition of iron-based alloy powder even when the amount of diffused phase is small as mentioned above. On the contrary, when the particle size of powder is too large as a whole, they cannot diffuse uniformly into the matrix. Accordingly, the effect to suppress thermal expansion decreases locally and, as a result, the effective suppressing of thermal expansion may not be attained.

For the above reason, the iron-based alloy powder has preferably a particle size of smaller than 100 mesh (100 mesh through) and more preferably contain 40% or more of the powder having a particle size of 50 μm or more. When the quantity of iron-based alloy powder having a particle size of 50 μm or more is less than 40%, the amount of finer powder is too large and the effect to suppress the thermal expansion is reduced, in addition, the thermal conductivity of the matrix becomes low.

As the pure copper powder used for the matrix powder, it is preferable that the pure copper powder has a particle size of smaller than 100 mesh and contains 60% or less of the powder of the particle size of 50 μm or more, so that the particle size of the pure copper powder is smaller than that of above-mentioned iron-based powder. Concerning the precipitation hardening copper alloy powder, it is preferable that the particle size is smaller than 100 mesh and contains 70% or less of the powder having a particle size of 50 μm or more, so that precipitation hardening copper alloy power has a smaller particle size than that of the above-mentioned iron-based alloy powder.

When both the precipitation hardening copper alloy powder and the pure copper powder are used simultaneously, it is preferable to use the pure copper powder of finer particle size as compare with the precipitation hardening copper alloy powder. By preparing a matrix powder mixture in the manner as the above, the possibility of existence of the pure copper powder particles increases among the precipitation hardening copper alloy powder and/or the iron-based alloy powder. Through the compacting and sintering of such a matrix powder, a network structure of the dispersion of pure copper phase can be formed, which is desirable in view of the thermal conductivity.

In view of this fact, when both the precipitation hardening copper alloy powder and the pure copper powder are used simultaneously, it is more preferable that the pure copper powder has a particle size of smaller than 100 mesh and contains 40% or less of the powder of 50 µm or more in particle size. If the content of particles of 50 µm or more in particle size is more than 40%, the particle size distribution shifts to coarse side and the network structure of pure copper phase is hardly formed.

By regulating the particle sizes of the iron-based alloy powder and the matrix powder in accordance with the above-mentioned manner, it is possible to obtain the efficient thermal conductivity and the suppressing effect of thermal expansion.

BRIEF DESCRIPTION OF THE DRAWINGS

The invention will be described in more detail in connection with the appended drawings, wherein.

DESCRIPTION OF PREFERRED EMBODIMENTS

The following examples further illustrate the present invention but are not intended to limit the invention.

EXAMPLE 1

As shown in the following Table 1, iron-based alloy powders having a particle size of smaller than 100 mesh and the respective values in thermal expansion coefficients as measured below 100° C. were prepared, in which the content of the powder having the particle size of 50 µm or more was 40%.

TABLE 1

| Powder Composition % by mass | Thermal Expansion Coefficient $\times 10^{-6}/K$ |
|---|---|
| Fe—36Ni | 1.2 |
| Fe—31NI—5Co | 0.0 |
| Fe—29Ni—17Co | 5.3 |
| Fe—42Ni | 4.2 |
| Fe—44Ni | 6.0 |

Copper powder having a particle size of-smaller than 100 mesh and containing 40% of powder of 50 µm or more in particle size was prepared. The above-mentioned iron-based alloy powders were added to the copper powders in ratios as shown in Table 2. The powder mixtures were subjected to compacting under a pressure of 1470 MPa to obtain green compacts and they were sintered in an atmosphere of dissociated ammonia gas at temperatures as shown in Table 2 to obtain samples of 1-01 to 1-31. Thermal conductivities and thermal expansion coefficients of these samples were measured and the results are also shown in Table 2. Graphs made from the results shown in Table 2 are FIG. 1 to FIG. 4

TABLE 2

| Sample No. | Matrix Powder Powder Component | Matrix Powder Quantity | Iron-Based Alloy Powder Components % by mass | Iron-Based Alloy Powder Quantity % by mass | Sintering Temperature ° C. | Thermal Conductivity W/m · K | Thermal Expansion Coefficient ×10$^{-6}$ K |
|---|---|---|---|---|---|---|---|
| 1-01 | Cu | Remainder | — | 0 | 500 | 375 | 17.0 |
| 1-02 | Cu | Remainder | Fe—36Ni | 5 | 500 | 320 | 15.7 |
| 1-03 | Cu | Remainder | Fe—36Ni | 10 | 500 | 275 | 14.5 |
| 1-04 | Cu | Remainder | Fe—36Ni | 20 | 500 | 200 | 12.8 |
| 1-05 | Cu | Remainder | Fe—36Ni | 30 | 500 | 145 | 11.5 |
| 1-06 | Cu | Remainder | Fe—36Ni | 40 | 500 | 110 | 10.5 |
| 1-07 | Cu | Remainder | Fe—36Ni | 50 | 500 | 80 | 9.5 |
| 1-08 | Cu | Remainder | Fe—36Ni | 60 | 500 | 55 | 8.3 |
| 1-09 | Cu | Remainder | Fe—36Ni | 70 | 500 | 10 | 9.1 |
| 1-10 | Cu | Remainder | Fe—31Ni—5Co | 30 | 300 | 160 | 11.5 |
| 1-11 | Cu | Remainder | Fe—31Ni—5Co | 30 | 400 | 165 | 10.5 |
| 1-12 | Cu | Remainder | Fe—31Ni—5Co | 30 | 500 | 156 | 10.8 |
| 1-13 | Cu | Remainder | Fe—31Ni—5Co | 30 | 600 | 145 | 11.6 |
| 1-14 | Cu | Remainder | Fe—31Ni—5Co | 30 | 1000 | 53 | 15.0 |
| 1-15 | Cu | Remainder | Fe—31Ni—5Co | 40 | 300 | 130 | 10.6 |
| 1-16 | Cu | Remainder | Fe—31Ni—5Co | 40 | 400 | 135 | 9.6 |
| 1-17 | Cu | Remainder | Fe—31Ni—5Co | 40 | 500 | 131 | 9.7 |
| 1-18 | Cu | Remainder | Fe—31Ni—5Co | 40 | 600 | 114 | 10.3 |
| 1-19 | Cu | Remainder | Fe—31Ni—5Co | 40 | 1000 | 23 | 14.0 |
| 1-20 | Cu | Remainder | Fe—31Ni—5Co | 50 | 300 | 103 | 9.3 |
| 1-21 | Cu | Remainder | Fe—31Ni—5Co | 50 | 400 | 129 | 8.3 |
| 1-22 | Cu | Remainder | Fe—31Ni—5Co | 50 | 500 | 121 | 8.4 |
| 1-23 | Cu | Remainder | Fe—31Ni—5Co | 50 | 600 | 102 | 9.2 |
| 1-24 | Cu | Remainder | Fe—31Ni—5Co | 50 | 1000 | 20 | 14.0 |
| 1-25 | Cu | Remainder | Fe—29Ni—17Co | 30 | 500 | 148 | 13.0 |
| 1-26 | Cu | Remainder | Fe—29Ni—17Co | 40 | 500 | 115 | 11.5 |
| 1-27 | Cu | Remainder | Fe—29Ni—17Co | 50 | 500 | 85 | 10.5 |
| 1-28 | Cu | Remainder | Fe—42Ni | 30 | 500 | 147 | 13.0 |
| 1-29 | Cu | Remainder | Fe—42Ni | 40 | 500 | 113 | 11.5 |
| 1-30 | Cu | Remainder | Fe—42Ni | 50 | 500 | 83 | 10.4 |
| 1-31 | Cu | Remainder | Fe—44Ni | 40 | 500 | 83 | 13.5 |

In Samples 1-01 to 1-09 in Table 2, the quantities of iron-based alloy powder (Fe-36Ni) were varied relative to the quantity of copper powder. Through the comparison of these samples, the influences of the content of iron-based alloy powder on thermal conductivities and thermal expansion coefficients can be understood. These influences are indicated as a graph of FIG. 1. It is recognized that Sample 1-02 containing 5% by mass of iron-based alloy powder has lower thermal conductivity and smaller thermal expansion coefficient as compared with Sample 1-01, which does not contain the iron-based alloy powder (i.e., copper 100%), thus the thermal expansion coefficient was improved.

With the increase in the content of iron-based alloy powder, the thermal conductivities and the thermal expansion coefficients tend to lower. However, Sample 1-09, which contains more than 60% by mass of iron-based alloy powder, has an increased thermal expansion coefficient to the contrary. The reason for the change to the increasing of thermal expansion coefficient is supposed that the excess quantity of non-bonded iron-based alloy powder was formed in the sintering at 500° C. and it could not suppresses the expansion of copper. In other words, although the iron-based alloy powder particles being in contact with copper powder particles are bonded with the surfaces of copper powder particles, while the iron-based alloy powder particles themselves do not join to each other. Accordingly, it is supposed that the effect to suppress the thermal expansion could not be produced due to the occurrence of slipping among the interfaces of non-bonded iron-based alloy particles during the thermal expansion of copper.

In Samples 1-10 to 1-14, 1-15 to 1-19 and 1-20 to 1-24, the contents of iron-based alloy powder (Fe-36Ni-5Co) are 30%, 40%, and 50% by mass, respectively, in which the sintering temperatures were varied. By the comparison of these samples, the influences of sintering temperatures on thermal conductivity and thermal expansion coefficient can be understood. The results of these experiments are shown in graphs of FIG. 2 and FIG. 3. When the sintering temperature is elevated, the thermal conductivity tends to lower in the temperature range of 400° C., 500° C. and 600° C. The thermal conductivity lowers markedly at 1000° C. On the other hand, the thermal expansion coefficient decreases in the temperature range of 400° C. to 500° C. and subsequently, it tends to increase in higher temperatures. At the temperature of 1000° C., the thermal expansion coefficient increases markedly. It is supposed that the copper powder and the iron-based alloy powder were diffused together and the characteristics of the material was deteriorated in the sintering at 1000° C. In the sintering at a temperature of 300° C., the strength was worse because the sintering of the matrix did not advance. Regardless of the weight ratio of iron-based alloy powder, any sample exhibited similar tendency. In view of the above results, it is understood that the suitable sintering temperature is in the range of 400° C. to 600° C.

Figure 1:
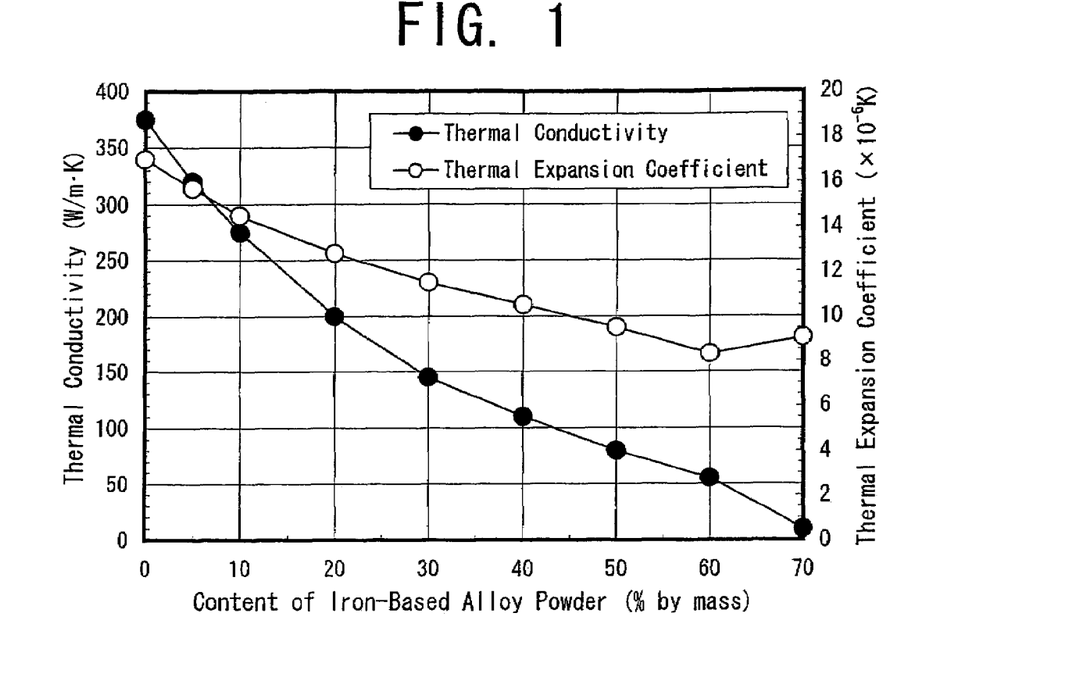
FIG. 1 is a graph showing the relationships between the addition quantity of iron-based alloy powder in copper powder and both thermal conductivity and thermal expansion coefficient
Figure 2:
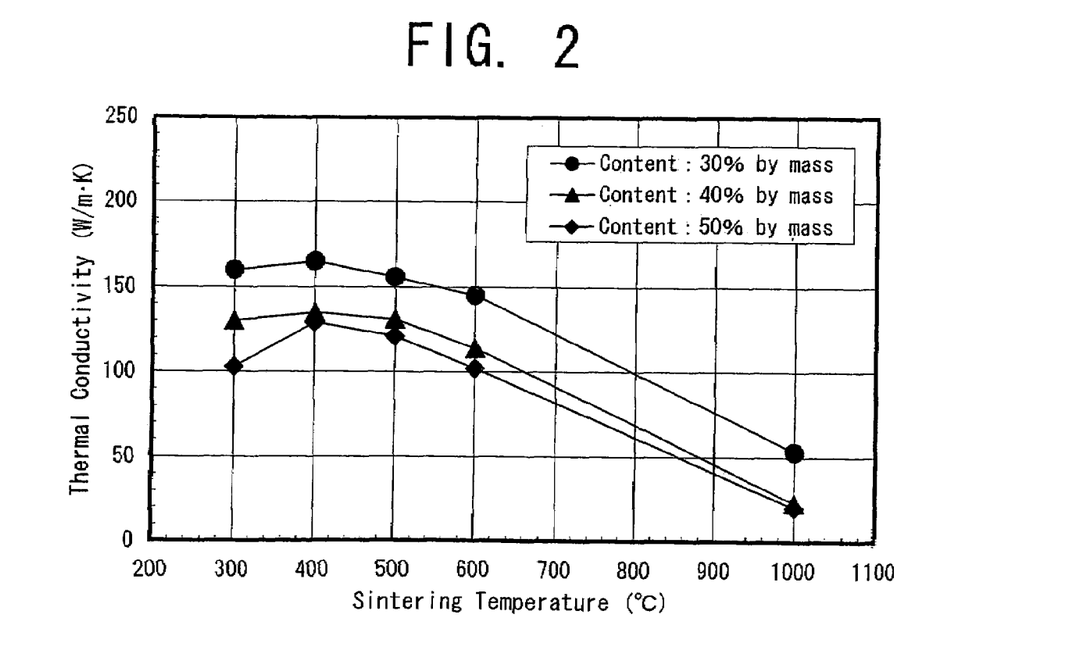
FIG. 2 is a graph showing the relationship between the sintering temperature and thermal conductivity with varying the addition quantity of iron-based alloy powder in copper powder.
Figure 3:
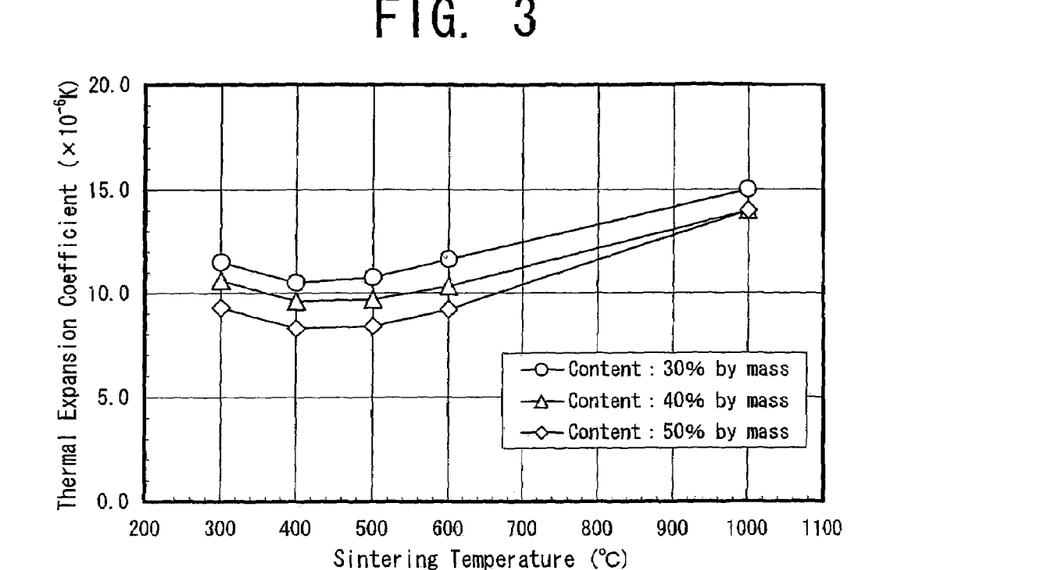
FIG. 3 is a graph showing the relationship between the sintering temperature and thermal expansion coefficient with varying the addition quantity of iron-based alloy powder in copper powder.
Figure 4:
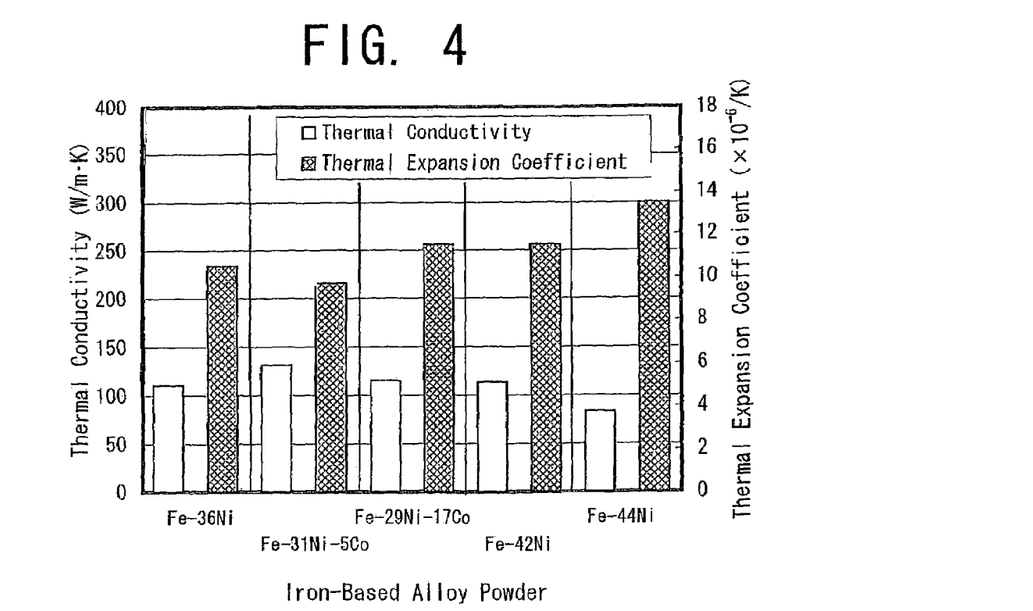
FIG. 4 is a graph showing the relationship between the kind of iron-based alloy powder and both the thermal conductivity and thermal expansion coefficient.

Samples 1-06, 1-17, 1-26, 1-29 and 1-31 were sintered at the temperature of 500° C. with the content of 40% by mass of iron-based alloy powders of different composition. By the comparison of these samples, the influences of the kind of iron-based alloy powder on the thermal conductivity and the thermal expansion coefficient can be understood. Such influences are indicated in FIG. 4. In any of samples containing the iron-based alloy powder having a thermal expansion coefficient of 6×10$^{-6}$/K or less as measured below 100° C., the values in thermal conductivity were almost the same regardless of the kind of iron-based alloy powder and the thermal expansion coefficient was suppressed to low values.

In view of the foregoing results, it was confirmed that the samples sintered at the temperature range of 400 to 600° C. and containing 5 to 60% by mass of dispersed iron-based alloy powder having a thermal expansion coefficient of 6×10$^{-6}$/K or less as measured below 100° C. that is dispersed in copper matrix, exhibits a small thermal expansion coefficient without excessively lowering the thermal conductivity.

EXAMPLE 2

Mixtures of copper powder having a particle size of smaller than 100 mesh and iron-based alloy powder of Fe-36Ni having a particle size of smaller than 100 mesh were subjected to compacting under a pressure of 1470 MPa. The compositions containing several quantities of powder materials in the designated particles sizes are shown in the following Table 3 as Samples of 1-06 and 1-32 to 1-39, in which the mixing ratios of the respective samples were the same as the mixing ratio of Sample 1-06 in Example 1, i.e., 60% by mass of pure copper powder and 40% by mass of iron-based alloy powder. The obtained green compacts were sintered at 500° C. in the atmosphere of dissociated ammonia gas. The thermal conductivities and the thermal expansion coefficients of these samples were measured, the results of which are also shown in Table 3.

TABLE 3

| Sample No. | Fe—36Ni Qty. of Powder of 50 μm or Less in Particle Size % | Cu Qty. of Powder of 50 μm or More in Particle Size % | Thermal Conductivity W/m · K | Thermal Expansion Coefficient ×10$^{-6}$/K |
|---|---|---|---|---|
| 1-32 | 100 | 60 | 83 | 10.5 |
| 1-33 | 80 | 60 | 95 | 10.5 |
| 1-34 | 60 | 60 | 103 | 10.5 |
| 1-06 | 40 | 60 | 110 | 10.5 |
| 1-35 | 20 | 60 | 117 | 10.5 |
| 1-36 | 0 | 60 | 125 | 10.5 |
| 1-37 | 40 | 40 | 120 | 10.5 |
| 1-38 | 40 | 80 | 95 | 10.5 |
| 1-39 | 40 | 100 | 80 | 10.5 |

Samples 1-06 and 1-32 to 1-36 comprise copper powder containing 60% of the powder having a particle size of 50 μm or more and iron-based alloy powder containing different quantities of powder having a particle size of 50 μm or less. By comparing these samples, the influences of the contents of the powder of 50 μm or less in particle size in the iron-based powder, on thermal conductivity and thermal expansion coefficient can be understood. In view of results in Table 3, it is understood that with the decrease of the content of powders having a particle size of 50 μm or less in the iron-based alloy powders, the thermal conductivity is improved although the thermal expansion coefficient is constant. Especially, in samples containing 60% or less of powder of 50 μm or less in particles size in the iron-based alloy powders had good thermal conductivities of more than 100 W/m·K.

Samples 1-06 and 1-37 to 1-39 comprises iron-based alloy powder containing 40% of the powder having a particle size of 50 μm or less, and different quantities of copper powder of 50 μm or more in particle size. By comparing these samples, the influences of the contents of copper powder of 50 μm or more in particle size on the thermal conductivity and the thermal expansion coefficient can be understood. It is recognized that with the increase of the content of copper powder having a particle size of 50 μm or more, the thermal conductivity is lowered. Samples containing 60% or less of copper powder having a particle size of 50 μm or more had good thermal conductivities of more than 100 W/m·K.

In view of the foregoing results, it was confirmed that, when the matrix powder has a particle size of smaller than 100 mesh and contains 60% or less of the powder of 50 μm or more in particle size and the above-mentioned iron-based alloy powder has a particle size of smaller than 100 mesh and contains 60% or less of the powder of 50 μm or less in particle size, the effect is especially high.

EXAMPLE 3

Several precipitation hardening copper alloy powders of smaller than 100 mesh containing 70% of 50 μm or more in particle size were prepared as shown in Tables 4 and 6. Meanwhile, pure copper powders of smaller than 100 mesh containing 40% of 50 μm or more in particle size were also prepared. Then the iron-based alloy powders shown in Table 1 were mixed with the prepared precipitation hardening copper alloy powders and the prepared copper powders in the ratios as shown in Tables 4 and 6. The powder mixtures were then subjected to compacting under the pressure of 1470 MPa and the obtained green compacts were sintered in the atmosphere of dissociated ammonia gas at temperatures as shown in Tables 5 and 7, to obtain Samples 2-01 to 2-37. Concerning each of these samples, the thermal conductivity, thermal expansion coefficient and hardness were measured, the results of which are also shown in Tables 5 and 7.

TABLE 4

| | Mixing Ratio, % by mass | | | | | Precipitation |
|---|---|---|---|---|---|---|
| | Precipitation Hardening Copper Alloy Powder | | Pure Copper | Iron-Based Alloy Powder | | Hardening Copper Alloy |
| Sample No. | Powder Components | Quantity | Powder Quantity | Powder Components | Quantity | Powder:Pure Copper Powder |
| 2-01 | Cu—0.3Ni—0.3Fe—0.15P | 100.0 | 0.0 | Fe—36Ni | 0.0 | 100:0 |
| 2-02 | Cu—0.3Ni—0.3Fe—0.15P | 95.0 | 0.0 | Fe—36Ni | 5.0 | 100:0 |
| 2-03 | Cu—0.3Ni—0.3Fe—0.15P | 90.0 | 0.0 | Fe—36Ni | 10.0 | 100:0 |
| 2-04 | Cu—0.3Ni—0.3Fe—0.15P | 80.0 | 0.0 | Fe—36Ni | 20.0 | 100:0 |
| 2-05 | Cu—0.3Ni—0.3Fe—0.15P | 70.0 | 0.0 | Fe—36Ni | 30.0 | 100:0 |

TABLE 4-continued

| Sample No. | Precipitation Hardening Copper Alloy Powder Components | Quantity | Pure Copper Powder Quantity | Iron-Based Alloy Powder Components | Quantity | Precipitation Hardening Copper Alloy Powder:Pure Copper Powder |
|---|---|---|---|---|---|---|
| 2-06 | Cu—0.3Ni—0.3Fe—0.15P | 52.5 | 17.5 | Fe—36Ni | 30.0 | 75:25 |
| 2-07 | Cu—0.3Ni—0.3Fe—0.15P | 35.0 | 35.0 | Fe—36Ni | 30.0 | 50:50 |
| 2-08 | Cu—0.3Ni—0.3Fe—0.15P | 17.5 | 52.5 | Fe—36Ni | 30.0 | 25:75 |
| 2-09 | Cu—0.3Ni—0.3Fe—0.15P | 0.0 | 70.0 | Fe—36Ni | 30.0 | 0:100 |
| 2-10 | Cu—0.3Ni—0.3Fe—0.15P | 60.0 | 0.0 | Fe—36Ni | 40.0 | 100:0 |
| 2-11 | Cu—0.3Ni—0.3Fe—0.15P | 45.0 | 15.0 | Fe—36Ni | 40.0 | 75:25 |
| 2-12 | Cu—0.3Ni—0.3Fe—0.15P | 40.0 | 20.0 | Fe—36Ni | 40.0 | 67:33 |
| 2-13 | Cu—0.3Ni—0.3Fe—0.15P | 30.0 | 30.0 | Fe—36Ni | 40.0 | 50:50 |
| 2-14 | Cu—0.3Ni—0.3Fe—0.15P | 20.0 | 40.0 | Fe—36Ni | 40.0 | 33:67 |
| 2-15 | Cu—0.3Ni—0.3Fe—0.15P | 15.0 | 45.0 | Fe—36Ni | 40.0 | 25:75 |
| 2-16 | Cu—0.3Ni—0.3Fe—0.15P | 0.0 | 60.0 | Fe—36Ni | 40.0 | 0:100 |
| 2-17 | Cu—0.3Ni—0.3Fe—0.15P | 50.0 | 0.0 | Fe—36Ni | 50.0 | 100:0 |
| 2-18 | Cu—0.3Ni—0.3Fe—0.15P | 40.0 | 0.0 | Fe—36Ni | 60.0 | 100:0 |
| 2-19 | Cu—0.3Ni—0.3Fe—0.15P | 40.0 | 0.0 | Fe—36Ni | 70.0 | 100:0 |

TABLE 5

| Sample No. | Sintering Temperature °C. | Thermal Conductivity W/m·K | Thermal Expansion Coefficient ×10⁻⁶/K | Hardness Hv |
|---|---|---|---|---|
| 2-01 | 500 | 225 | 17.0 | 141 |
| 2-02 | 500 | 192 | 15.7 | 141 |
| 2-03 | 500 | 165 | 14.5 | 141 |
| 2-04 | 500 | 120 | 12.8 | 141 |
| 2-05 | 500 | 88 | 11.5 | 128 |
| 2-06 | 500 | 125 | 11.5 | 128 |
| 2-07 | 500 | 140 | 11.5 | 128 |
| 2-08 | 500 | 142 | 11.5 | 114 |
| 2-09 | 500 | 145 | 11.5 | 73 |
| 2-10 | 500 | 66 | 10.5 | 138 |
| 2-11 | 500 | 96 | 10.5 | 138 |
| 2-12 | 500 | 102 | 10.5 | 138 |
| 2-13 | 500 | 107 | 10.5 | 138 |
| 2-14 | 500 | 108 | 10.5 | 132 |
| 2-15 | 500 | 110 | 10.5 | 124 |
| 2-16 | 500 | 110 | 10.5 | 82 |
| 2-17 | 500 | 50 | 9.5 | 139 |
| 2-18 | 500 | 42 | 8.3 | 138 |
| 2-19 | 500 | 32 | 8.9 | 138 |

TABLE 6

| Sample No. | Precipitation Hardening Copper Alloy Powder Components | Quantity | Pure Copper Powder Quantity | Iron-Based Alloy Powder Components | Quantity | Precipitation Hardening Copper Alloy Powder:Pure Copper Powder |
|---|---|---|---|---|---|---|
| 2-20 | Cu—0.3Ni—0.3Fe—0.15P | 60.0 | 0.0 | Fe—36Ni | 40.0 | 100:0 |
| 2-21 | Cu—0.3Ni—0.3Fe—0.15P | 60.0 | 0.0 | Fe—31Ni—5Co | 40.0 | 100:0 |
| 2-22 | Cu—0.3Ni—0.3Fe—0.15P | 60.0 | 0.0 | Fe—31Ni—5Co | 40.0 | 100:0 |
| 2-23 | Cu—0.3Ni—0.3Fe—0.15P | 60.0 | 0.0 | Fe—31Ni—5Co | 40.0 | 100:0 |
| 2-24 | Cu—0.3Ni—0.3Fe—0.15P | 60.0 | 0.0 | Fe—31Ni—5Co | 40.0 | 100:0 |
| 2-25 | Cu—0.3Ni—0.3Fe—0.15P | 60.0 | 0.0 | Fe—29Ni—17Co | 40.0 | 100:0 |
| 2-26 | Cu—0.3Ni—0.3Fe—0.15P | 60.0 | 0.0 | Fe—42Ni | 40.0 | 100:0 |
| 2-27 | Cu—0.3Ni—0.3Fe—0.15P | 60.0 | 0.0 | Fe—44Ni | 40.0 | 100:0 |
| 2-28 | Cu—0.6Cr | 60.0 | 0.0 | Fe—36Ni | 40.0 | 100:0 |
| 2-29 | Cu—0.6Cr | 60.0 | 0.0 | Fe—31Ni—5Co | 40.0 | 100:0 |
| 2-30 | Cu—0.6Cr | 60.0 | 0.0 | Fe—29Ni—17Co | 40.0 | 100:0 |
| 2-31 | Cu—0.6Cr | 60.0 | 0.0 | Fe—42Ni | 40.0 | 100:0 |
| 2-32 | Cu—0.6Cr | 60.0 | 0.0 | Fe—44Ni | 40.0 | 100:0 |
| 2-33 | Cu—0.1Zr | 60.0 | 0.0 | Fe—36Ni | 40.0 | 100:0 |
| 2-34 | Cu—0.1Zr | 60.0 | 0.0 | Fe—31Ni—5Co | 40.0 | 100:0 |
| 2-35 | Cu—0.1Zr | 60.0 | 0.0 | Fe—29Ni—17Co | 40.0 | 100:0 |

TABLE 6-continued

| | Mixing Ratio, % by mass | | | | | Precipitation |
|---|---|---|---|---|---|---|
| | Precipitation Hardening Copper Alloy Powder | | Pure Copper | Iron-Based Alloy Powder | | Hardening Copper Alloy |
| Sample No. | Powder Components | Quantity | Powder Quantity | Powder Components | Quantity | Powder:Pure Copper Powder |
| 2-36 | Cu—0.1Zr | 60.0 | 0.0 | Fe—42Ni | 40.0 | 100:0 |
| 2-37 | Cu—0.1Zr | 60.0 | 0.0 | Fe—44Ni | 40.0 | 100:0 |

TABLE 7

| | | Evaluation | | |
|---|---|---|---|---|
| Sample No. | Sintering Temperature ° C. | Thermal Conductivity W/m · K | Thermal Expansion Coefficient ×10⁻⁶/K | Hardness Hv |
| 2-20 | 300 | 78 | 10.6 | 127 |
| 2-21 | 400 | 81 | 9.6 | 135 |
| 2-22 | 500 | 77 | 9.9 | 138 |
| 2-23 | 600 | 69 | 10.7 | 131 |
| 2-24 | 1000 | 23 | 14.0 | 83 |
| 2-25 | 500 | 69 | 11.5 | 138 |
| 2-26 | 500 | 68 | 11.5 | 138 |
| 2-27 | 500 | 68 | 12.1 | 138 |
| 2-28 | 500 | 110 | 10.5 | 160 |
| 2-29 | 500 | 110 | 10.3 | 160 |
| 2-30 | 500 | 115 | 11.5 | 138 |
| 2-31 | 500 | 113 | 12.1 | 164 |
| 2-32 | 500 | 110 | 13.6 | 164 |
| 2-33 | 500 | 110 | 10.5 | 153 |
| 2-34 | 500 | 110 | 10.3 | 153 |
| 2-35 | 500 | 115 | 11.5 | 138 |
| 2-36 | 500 | 113 | 11.5 | 157 |
| 2-37 | 500 | 110 | 12.1 | 156 |

Samples 2-01 to 2-05, 2-10 and 2-17 to 2-19 are composed of precipitation hardening copper alloy powder (Cu-0.3Ni-0.3Fe-0.15P) and iron-based alloy powder (Fe-36Ni), in which the mixing ratios are varied to each other. By comparing these samples, the influence of the contents of the iron-based alloy powder on the thermal conductivity, thermal expansion coefficient and hardness are understood. The graph on FIG. 5 indicates the relationship between the addition quantities of iron-based alloy powder and both the thermal conductivity and thermal expansion coefficient.

Figure 5:
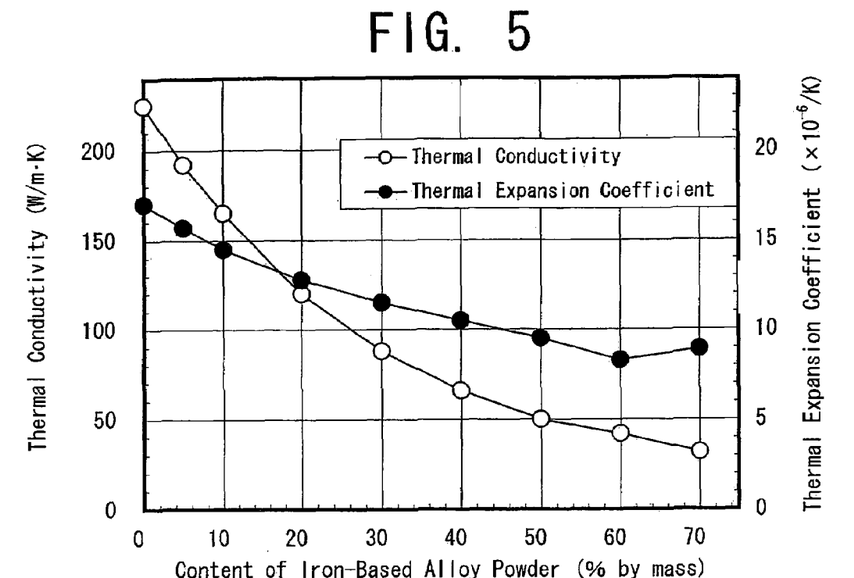
FIG. 5 is a graph showing the relationship between the addition quantity of iron-based alloy powder in precipitation hardening copper alloy powder and both the thermal conductivity and thermal expansion coefficient.

In view of these results, it is understood that Sample 2-02 containing of 5% by mass of the iron-based alloy powder has a smaller thermal conductivity and a smaller thermal expansion coefficient as compared with those of Sample 2-01 containing no iron-base alloy powder. With the increase of the addition quantity of iron-based alloy powder, the values in thermal conductivity and thermal expansion coefficient tend to decrease. However, in Sample 2-19 containing more than 60% by mass of the iron-based alloy powder, the thermal expansion coefficient increases to the contrary. The tendency to increase the thermal expansion coefficient is supposed to occur for the reason that excessive quantity of iron-based alloy powder without bonding is formed in the sintering at 500° C., so that it was not possible to suppress the expansion of the matrix of precipitation hardening copper alloy. In other words, although the iron-based alloy powders are bonded with the precipitation hardening copper alloy powder in the contacting surface layer, the iron-based alloy powder particles are not bonded together.

Accordingly, it is considered that the suppressing effect on thermal expansion could not be produced in the thermal expanding of copper owing to the occurrence of slipping among the interfaces of non-bonded iron-based alloy powder particles.

Samples 2-05 to 2-09 and 2-10 to 2-16 contain the same quantity of iron-based alloy powder (Fe-36Ni), respectively. The mixing ratios of precipitation hardening copper alloy powder (Cu-0.3Ni-0.3Fe-0.15P) and pure copper powder were varied. When these samples are compared to one another, the influences of the mixing ratios of pure copper powder in the matrix powder on the thermal conductivity, thermal expansion coefficient and hardness are understood. The relationship between the mixing ratios of the pure copper powder and the thermal conductivity is shown in the graph on FIG. 6, and the relationship between the mixing ratios of the pure copper powder and the hardness is shown in the graph on FIG. 7.

Figure 6:
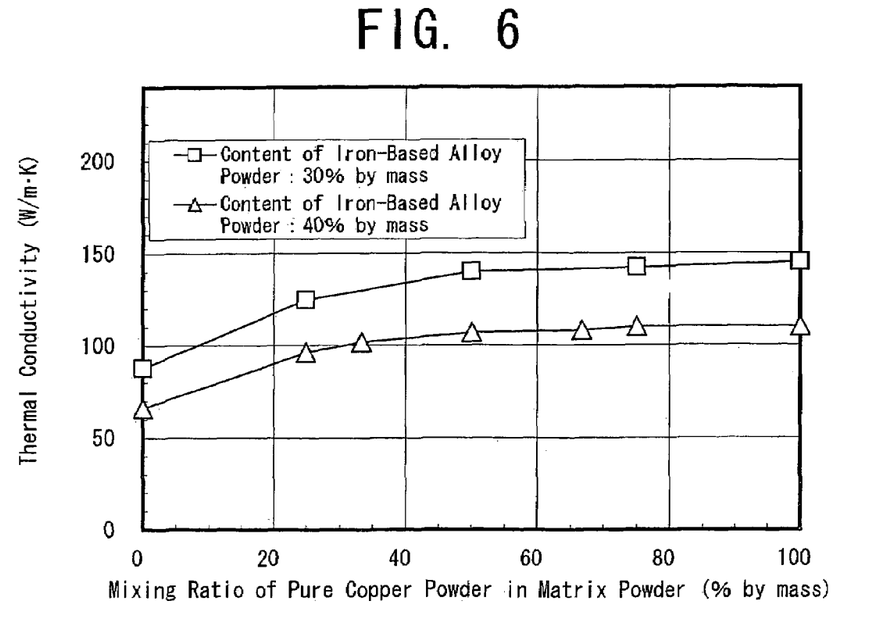
FIG. 6 is a graph showing the relationship between the thermal conductivity and the mixing ratio of pure copper powder in matrix powder containing the remainder of precipitation hardening copper alloy powder with a constant content of iron-based alloy powder.
Figure 7:
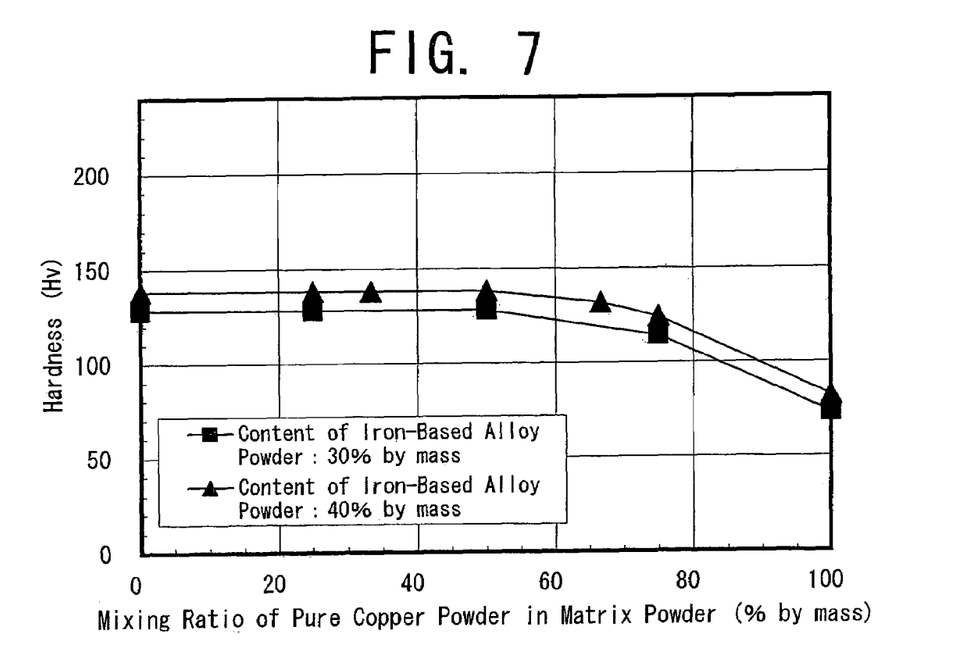
FIG. 7 is a graph showing the relationship between the hardness and the mixing ratio of pure copper powder in matrix powder containing the remainder of precipitation hardening copper alloy powder with a constant content of iron-based alloy powder.

In view of these results, it is understood that the thermal expansion coefficient is constant even when the pure copper powder is added to the precipitation hardening copper alloy powder in view of Tables 4 and 5, however, the thermal conductivity increases by the addition of 25% by mass of pure copper powder in view of FIG. 6. It is understood, however, that the addition more than 50% by mass gives only small improvement in the thermal conductivity for the increased addition quantity. Meanwhile, the hardness is maintained at a high constant value to the addition quantity of 50% by mass of pure copper powder, and when the addition quantity exceeds 50% by mass, the value tends to lower. If the addition quantity is more than 75% by mass, the hardness lowers markedly in view of FIG. 7. Accordingly, it is understood that the addition of pure copper powder to precipitation hardening copper alloy powder can improve the thermal conductivity but 75% by mass or less of addition quantity is suitable in view of hardness.

The sintering temperatures were varied in Samples 2-20 to 2-24 composed of the mixed powder of 60% by mass of precipitation hardening copper alloy powder (Cu-0.3Ni-0.3Fe-0.15P) and 40% by mass of iron-based alloy powder (Fe-36Ni). By comparing these samples, the influences of sintering temperatures on the thermal conductivity, thermal expansion coefficient and hardness are understood. The relationship between the sintering temperatures and both the thermal conductivity and thermal expansion coefficient is indicated in a graph on FIG. 8, and the relationship between the sintering temperatures and hardness is shown on FIG. 9.

Figure 8:
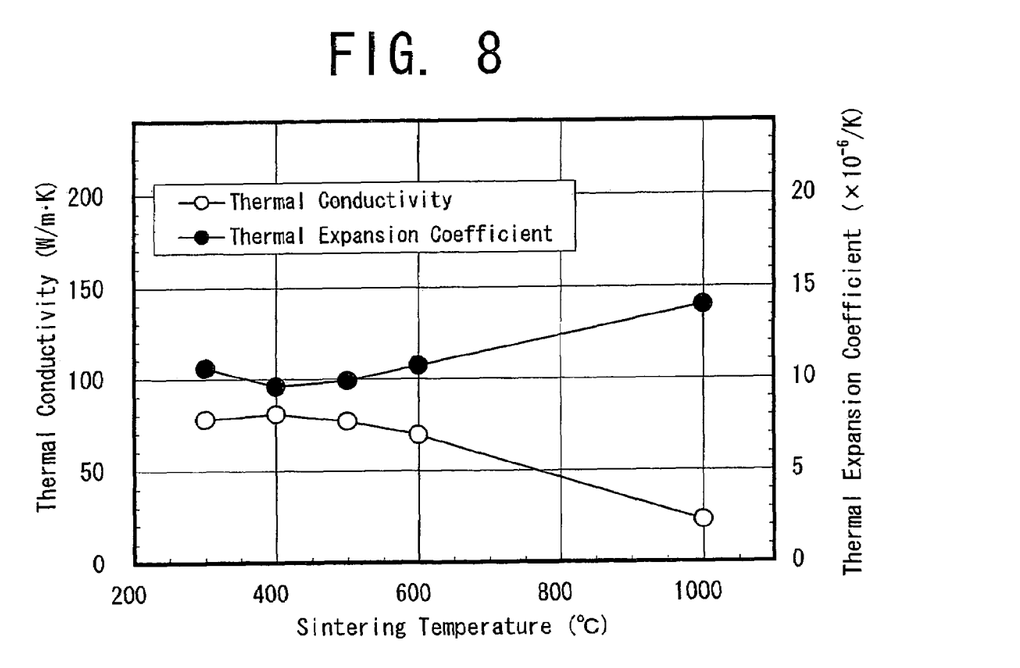
FIG. 8 is a graph showing the relationship between the sintering temperature and, both thermal conductivity and thermal expansion coefficient with constant mixing, ratios of precipitation hardening copper alloy powder and iron-based alloy powder.
Figure 9:
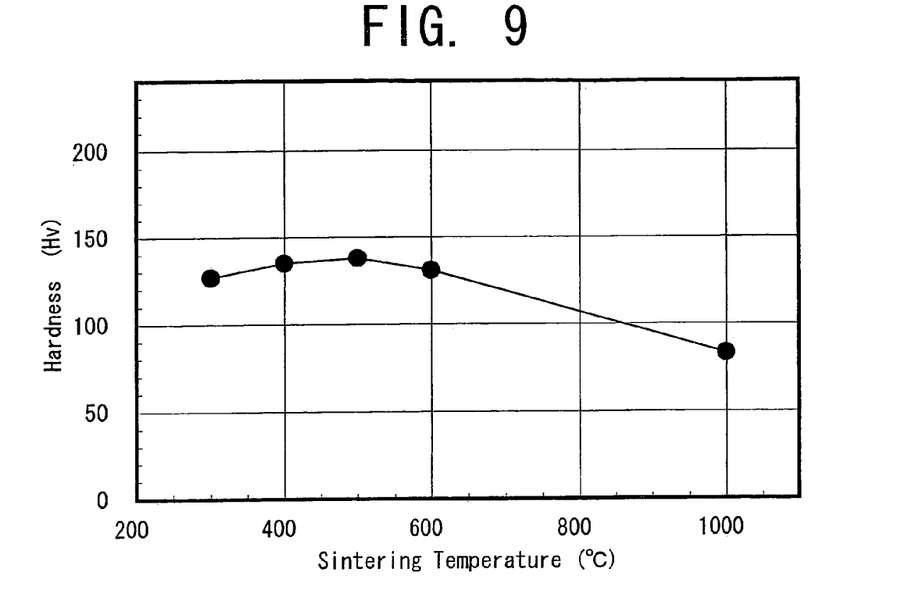
FIG. 9 is a graph showing the relationship between the sintering temperature and hardness with constant mixing ratios of precipitation hardening copper alloy powder and iron-based alloy powder.

In view of these results, it is understood that the thermal conductivity is improved when the sintering temperature is raised up to 400° C., while it tends to lower in the range of 500° C. to 600° C., and it lowers further in the range up to the sintering temperature of 1000° C. Meanwhile, concerning the value in thermal expansion coefficient, it lowers with the rise of sintering temperature up to 400° C., after that, it tends to increase and the value further increases markedly near 1000° C. Concerning the hardness, it increases with the rise of sintering temperature to the peak of 500° C. and, above that temperature, it tends to decrease with a marked low value at 1000° C. It is supposed that these phenomena are caused by the fact that the copper powder and the iron-based alloy powder are diffused to each other to lower the characteristics through the sintering at 1000° C. Incidentally, the strength was not good at the sintering temperature of 300° C. because the sintering of the matrix was not caused to advance.

Regardless of the addition quantities, the same tendencies were observed, so that it is considered that the preferable sintering temperature is in the range of 400° C. to 600° C.

In Samples 2-10, 2-22, 2-25 to 2-27, Samples 2-28 to 2-32 and Samples 2-33 to 2-37, respectively, different kinds of iron-based alloy powders having thermal expansion coefficient of $6\times10^{-6}$/K or less as measure below 100° C., were changed relative to the same precipitation hardening copper alloy powder. In Sample 2-16, the comparison was made with pure copper powder without using precipitation hardening copper alloy powder. Through the comparison of these samples, the variation in thermal conductivity, thermal expansion coefficient and hardness are understood with the change of kinds of the iron-based alloy powders. These relationships are shown as bar graphs in FIG. 10 to FIG. 12. The numerals on the tops of bars indicate the respective sample numbers.

Figure 10:
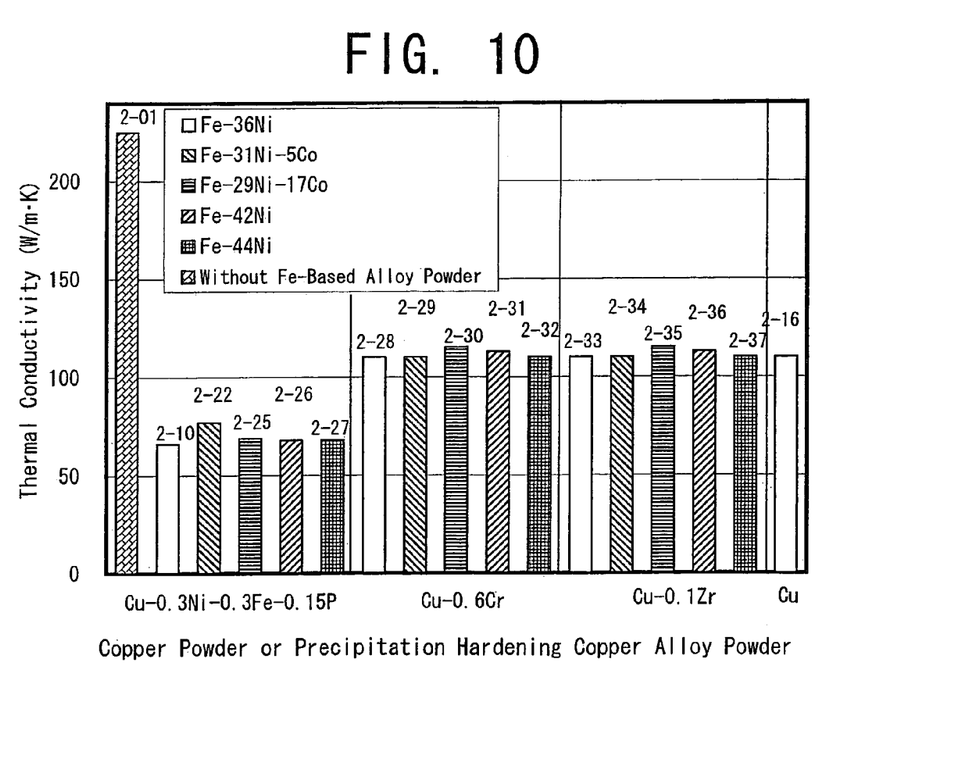
FIG. 10 is a graph showing the comparison of thermal conductivities of pure copper powder or various kinds of precipitation hardening copper alloy powders containing various kinds of iron-based alloy powder.
Figure 11:
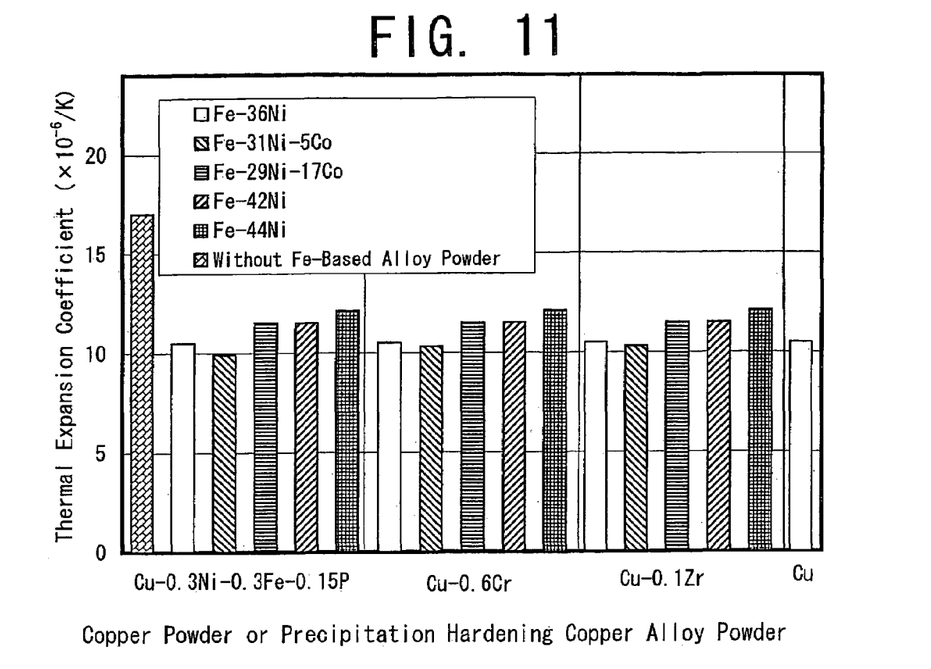
FIG. 11 is a graph showing the comparison of thermal expansion coefficient of pure copper powder or various kinds of precipitation hardening copper alloy powders containing various kinds of iron-based alloy powder.
Figure 12:
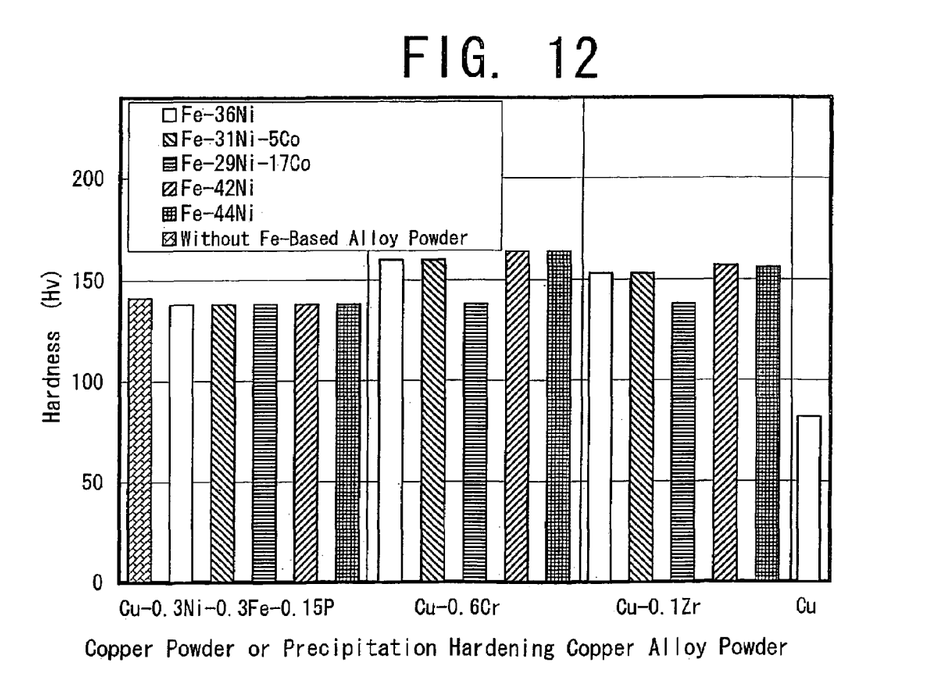
FIG. 12 is a graph showing the comparison of hardness of pure copper powder or various kinds of precipitation hardening copper alloy powders containing various kinds of iron-based alloy powder.

In view of these results, it is understood that the thermal conductivity is changed according to the change of thermal conductivity of matrix, but it is scarcely influenced by the kind of iron-based alloy powder. Furthermore, the thermal expansion coefficient is lower than the case in which the iron-based alloy powder is not used, and almost similar values are obtained when any kind of iron-based alloy powder is used. It is also confirmed that the hardness is larger in the use of any precipitation hardening copper alloy powder and iron-based alloy powder as compared with the use of pure copper and iron-based alloy powder.

In view of the foregoing results, it is confirmed that samples containing 5 to 60% by mass of the dispersion of iron-based alloy powder having a thermal expansion coefficient of $6\times10^{-6}$/K or less as measured below 100° C. in copper matrix, have high thermal conductivities and small thermal expansion coefficients. It is also confirmed that samples sintered at temperature range of 400° C. to 600° C. have high thermal conductivities, small thermal expansion coefficients and increased value in hardness.

Further-more; it is confirmed that, even when the kind of iron-based alloy powder having a thermal expansion coefficient of $6\times10^{-6}$/K or less as measured below 100° C. is changed, the obtained materials have almost same values in thermal expansion coefficient and hardness, regardless of the kind of precipitation hardening copper alloy powder, although the thermal conductivity varies with the characteristics of the precipitation hardening copper alloy powder. The above-mentioned variation in thermal conductivity owing to the precipitation hardening copper alloy powder can be improved by the addition of 75% by mass or less of pure copper powder, so that the effect of the present invention could be confirmed.

EXAMPLE 4

As indicated in Table 8, pure copper powder, precipitation hardening copper alloy powder of Cu-0.3Ni-0.3Fe-0.15P alloy and iron-based-alloy powder of Fe-36Ni having a thermal expansion coefficient of $6\times10^{-6}$/K or less as measure below 100° C. were used. Powder mixtures were prepared by mixing 30% by mass of precipitation hardening copper alloy powder, 30% by mass of pure copper powder and 40% by mass of iron-based alloy powder. Green compacts of the powder mixtures were prepared through the compacting under a pressure of 1470 MPa, which is followed by sintering in an atmosphere of dissociated ammonia gas at a temperature of 500° C. to obtain Samples 2-38 to 2-50. The thermal conductivity and hardness of each sample were measured, the results of which are indicated in Table 8 together with the results of sample of 2-13 in Example 3.

TABLE 8

| | Ratio of Powder of 50 μm or more in Particle Size % by mass | | | | |
|---|---|---|---|---|---|
| Sample No. | Precipitation Hardening Copper Alloy Powder | Pure Copper Powder | Iron-Based Alloy Powder | Thermal Expansion Coefficient W/m · K | Hardness Hv |
| 2-13 | 70 | 40 | 40 | 107 | 138 |
| 2-38 | 100 | 40 | 40 | 88 | 138 |
| 2-39 | 75 | 40 | 40 | 105 | 138 |
| 2-40 | 50 | 40 | 40 | 112 | 135 |
| 2-41 | 25 | 40 | 40 | 110 | 133 |
| 2-42 | 0 | 40 | 40 | 100 | 130 |
| 2-43 | 70 | 60 | 40 | 90 | 132 |
| 2-44 | 70 | 50 | 40 | 95 | 133 |
| 2-45 | 70 | 30 | 40 | 110 | 138 |
| 2-46 | 70 | 0 | 40 | 115 | 138 |
| 2-47 | 70 | 40 | 30 | 95 | 132 |
| 2-48 | 70 | 40 | 50 | 111 | 138 |
| 2-49 | 70 | 40 | 60 | 113 | 138 |
| 2-50 | 70 | 40 | 100 | 115 | 138 |

Figure 13:
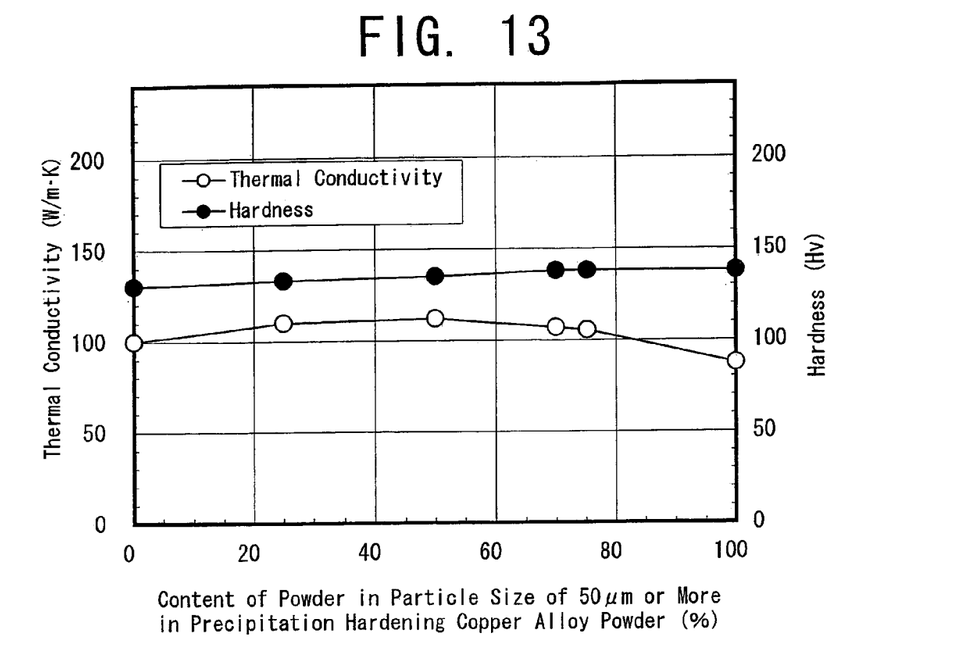
FIG. 13 is a graph showing the influence of the content of powder having a particle size of 50 µm or more in precipitation hardening copper alloy powder on both thermal conductivity and hardness, in the case that a pre-mixture of precipitation hardening copper alloy powder and pure copper powder are used for the matrix powder.

By comparing Samples 2-13, 2-38 to 2-42, the influences on thermal conductivity and hardness of the content of the powder having a particle size of 50 μm or more in the precipitation hardening copper alloy powder can be understood, which influences are indicated on a graph in FIG. 13. The thermal conductivity is improved to some extent with the increase of the content of powder having a particle size of 50 μm or more in the precipitation hardening copper alloy powder, however, the thermal conductivity lowers when the content is more than 75%.

The above fact is considered to occur for the reason that the particles of precipitation hardening copper alloy powder of small size have larger surface areas and provide many contact points among them, or among the powder particles of the precipitation hardening copper alloy powder and the pure copper powder or the iron-based alloy powder. Thus the many contact points accelerate the diffusion and makes the matrix dense with the result of improved thermal conductivity of the matrix. If the particle size of precipitation hardening copper alloy powder is smaller than that of pure copper powder, it is considered that the formation of network of pure copper phase is hindered and a part of the pure copper phase is cause to isolate and to disperse resulting in the slight lowering in thermal conductivity.

Meanwhile, when the content of powder having a particle size of 50 μm or more in the precipitation hardening copper alloy powder is more than 75%, the proportion of precipitation hardening copper alloy powder increases locally and the uniform heat transfer is suppressed. In view of these results, it is confirmed that the content of the powder having a particle size of 50 μm or more in the precipitation hardening copper alloy powder is preferably 70% or less.

Figure 14:
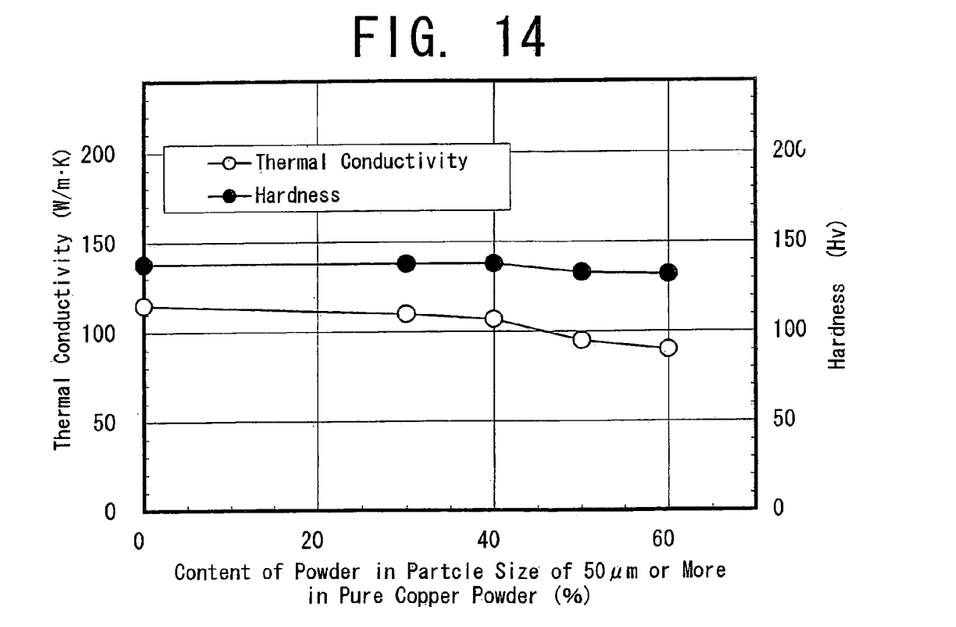
FIG. 14 is a graph showing the influence of the content of powder having a particle size of 50 µm or more in pure copper powder on both thermal conductivity and hardness, in the case that a pre-mixture of precipitation hardening copper alloy powder and pure copper powder are used for the matrix powder.

Through comparison on Samples 2-13 and 2-43 to 2-46, the influences of the content of the powder having a particle size of 50 μm or more in pure copper powder on thermal conductivity and hardness can be understood. FIG. 14 is a graph showing the influences. In view of these results, it is observed that when the content of the powder having a particle size of 50 μm or more in pure copper powder is 40% or less, the thermal conductivity is almost constant value, having a slightly lowering tendency when it exceeds 40%.

The reason for this fact is considered that in the side of smaller particle size of pure copper alloy powder, the particles have larger surface areas and have more contacting points among the pure copper powder particles, or between the pure copper powder particles and the precipitation hardening copper alloy powder particles or the iron-based alloy powder particles. This accelerates the powders to diffuse together and makes the matrix dense, as a result, the thermal conductivity of the matrix is improved. In addition, the possibility of fine pure copper powder to exist in the spaces of the precipitation hardening copper alloy powder and/or the iron-based alloy powder to form a pure copper phase of network structure.

Meanwhile, when the content of the powder having a particle size of 50 μm or more exceeds 40% in the pure copper powder, it is-considered that the formation of network structure is hindered locally and the lowering of thermal conductivity is caused to occur. Therefore, it was confirmed that the content of the powder having a particle size of 50 μm or more in the pure copper powder is preferably 40% or less.

By comparing Samples 2-13 and 2-47 to 2-50, the influence of the content of powder having a particle size of 50 μm or more in iron-based alloy powder on thermal conductivity and hardness can be understood. A graph on FIG. 15 indicates these results.

Figure 15:
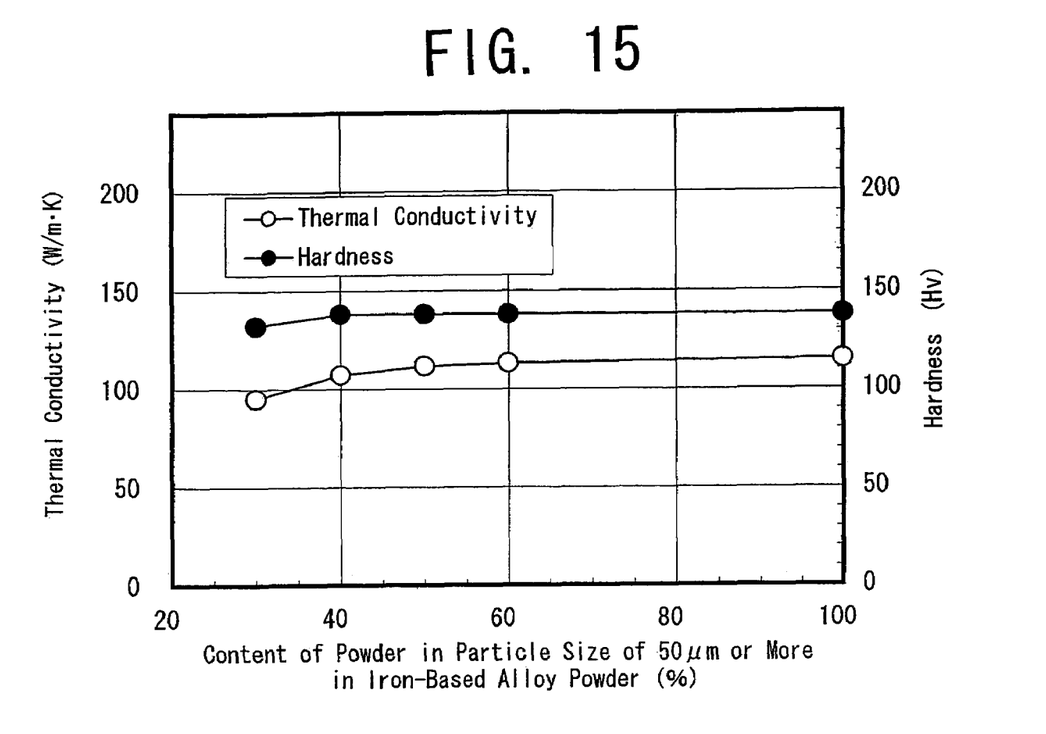
FIG. 15 is a graph showing the influence of the content of powder having a particle size of 50 µm or more in iron-based alloy powder on both-thermal conductivity and hardness, in the case that a pre-mixture of precipitation hardening copper alloy powder and pure copper powder are used for the matrix powder.

In view of the foregoing results, it is observed that when the content of the powder having a particle size of 50 μm or more in the iron-based alloy powder is 40% or more, the value in thermal conductivity is almost constant, while if it is less than 40%, the slight tendency of lowering the thermal conductivity is observed. It is considered that the lowering in thermal conductivity is caused to occur the distribution of iron-based alloy power shifts to the side of fine particles to facilitate the diffusion in the matrix. Therefore, it was confirmed that the content of the powder having a particle size of 50 μm or more in the iron-based alloy powder is preferably 40% or more.

What is claimed is:

1. A method for producing a copper-based material with low thermal expansion and high heat conductivity, which consists of the steps:
   adding 5 to 60% by mass of iron-based alloy powder having a thermal expansion coefficient of $6 \times 10^{-6}$/K or lower as measured below 100° C. into a matrix powder consisting of precipitation hardening copper alloy powder,
   mixing said iron-based alloy powder and said matrix powder to form a powder mixture of them,
   compacting said powder mixture under pressure into a green compact having a relative density of 93% or more, and
   sintering said green compact at a temperature in the range of 400 to 600° C.,
   wherein said method does not include additional solution treatment or additional aging treatment,
   wherein said precipitation hardening copper alloy powder is prepared by rapid solidification of molten precipitation hardening copper alloy,
   the particles of said precipitation hardening copper alloy powder are smaller than 100 mesh and the content of the powder having a particle size of 50 μm or more is 70% or less, and
   the particles of said iron-based alloy powder are smaller than 100 mesh and the content of the powder having a particle size of 50 μm or less is 60% or less.

2. A method for producing a copper-based material with low thermal expansion and high heat conductivity, which consists of the steps:
   preparing a matrix powder by adding 75% by mass or less of pure copper powder to precipitation hardening copper alloy powder,
   further adding 5 to 60% by mass of iron-based alloy powder having a thermal expansion coefficient of $6 \times 10^{-6}$/K or lower as measured below 100° C. to said matrix powder,
   mixing said powders to form a powder mixture of them,
   compacting said powder mixture under pressure into a green compact having a relative density of 93% or more, and
   sintering said green compact at a temperature in the range of 400 to 600° C.,
   wherein said method does not include additional solution treatment or additional aging treatment,
   wherein said precipitation hardening copper alloy powder is prepared by rapid solidification of molten precipitation hardening copper alloy,
   the particles of said copper powder are smaller than 100 mesh and the content of the powder having a particle size of 50 μm or more is 60% or less,
   the particles of said precipitation hardening copper alloy powder are smaller than 100 mesh and the content of the powder having a particle size of 50 μm or more is 70% or less, and
   the particles of said iron-based alloy powder are smaller than 100 mesh and the content of the powder having a particle size of 50 μm or less is 60% or less.

3. The method for producing the copper based material with low thermal expansion and high heat conductivity as claimed in claim 2, wherein said matrix powder is a mixture of copper powder and precipitation hardening copper ahoy powder, the particle size of said copper alloy powder is smaller than 100 mesh and the content of the powder in said copper alloy powder having a particle size of 50 μm or more is 40% or less.

4. The method for producing the copper based material with low thermal expansion and high heat conductivity in claim 1 or claim 2, wherein said green compact is sintered at a temperature in the range of 400° C. to lower than 600° C.

5. The method for producing the copper based material with low thermal expansion and high heat conductivity in claim 1 or claim 2, wherein said green compact is sintered at a temperature in the range of 400° C. to 500° C.

6. The method for producing the copper based material with low thermal expansion and high heat conductivity in claim 1 or claim 2,
   wherein said method does not include additional solution treatment or additional aging treatment, and
   wherein said precipitation hardening copper alloy powder being in the condition like the solution treatment being effected, and in the condition like the aging treatment being effected simultaneously with the sintering.

* * * * *